BISTABLE TRANSMISSION GATE

Filed Dec. 11, 1961

INVENTOR
J. H. McGUIGAN
BY Harry C. Hart
ATTORNEY

United States Patent Office 3,222,541
Patented Dec. 7, 1965

3,222,541
BISTABLE TRANSMISSION GATE
John H. McGuigan, Summit, N.J., assignor to Bell Telephone Laboratories, Incorporated, New York, N.Y., a corporation of New York
Filed Dec. 11, 1961, Ser. No. 158,418
10 Claims. (Cl. 307—88.5)

This invention relates to electronic gating, particularly by gates that employ negative resistance diodes.

An electronic gate is constituted of a gating path linking a source with a load and a control path for selectively opening and closing the gate.

Typically, the gating path includes rectifying diodes that are similarly poled with respect to a control point. Then, a voltage of one polarity at the control point places the diodes in a low resistance condition, opening the gate and passing the wave from the source to the load. And a voltage of opposite polarity places the diodes in a high resistance condition, closing the gate and blocking the source wave. Hence, closed and open gates correspond respectively to open and closed switches. In either case the gate can retain its gating condition only so long as its control signal is applied. Thus, with telephone switching, a control signal that opens the gate on commencement of a conversation must be maintained throughout the conversational interval. Consequently, the inherent structural simplicity of an ordinary diode gate is offset by its inability to hold its gating condition in the absence of a control signal. On the other hand, to provide such a gate with holding action ordinarily requires extensive modification.

Accordingly, it is an object of the invention to enhance the utility of electronic gating. A concurrent object is to achieve holding action with momentarily applied control signals. An additional object is to realize the holding action with diode gating elements.

Of course, enhanced gating utility should not act to the detriment of gating efficiency. With the gate open, substantially all of the gated energy should pass to a load. But with the gate closed, the load should be isolated from the source. To the extent that there is energy leakage from the source to the load when the gate is closed, or diversion of energy from the source to the control path when the gate is open, gating efficiency is reduced. A control path configuration that suffices for one gating condition may be inappropriate for the other, especially when an electronic gate is to afford holding action as well.

Accordingly, it is a further object of the invention to increase gating efficiency. A still further object is to increase efficiency in conjunction with diode holding action.

In accomplishing the foregoing and related objects, the invention provides for gating path elements which are capable of bistable operation. Such elements can be biased to remain in stable equilibrium in either of two diverse signal states.

When the gating elements are diodes, they have current-voltage characteristics that are multivalued in current or voltage, thus permitting two-state operation. Since such characteristics must contain regions of negative resistance, the diodes are said to be of the negative resistance variety.

To render the diodes bistable, the control path includes a biasing impedance element. It is an attribute of the invention that the biasing element can also increase gating efficiency by limiting the leakage of source energy into (1) the control path when the gate is open and (2) into the load when the gate is closed. An appropriate biasing element is an additional negative resistance diode that is resistively padded and poled to provide a substantial impedance when the gate is open and a negligible impedance when the gate is closed.

Other attributes of the invention will become apparent after consideration of several illustrative embodiments taken in conjunction with the drawings in which.

Figure 1:
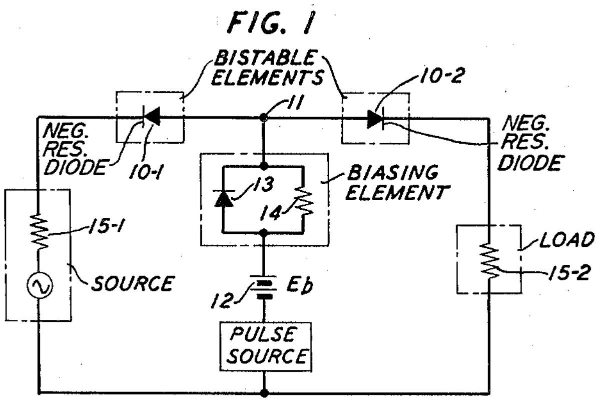
FIG. 1 is a schematic diagram of a circuit including a diode holding gate.

As shown in FIG. 1, a holding gate includes bistable gating elements in a gating path that links a source with a load.

When the elements are negative resistance diodes 10–1 and 10–2, they are biased to remain in stable equilibrium in either a low resistance signal state or a high resistance signal state. The gating diodes are similarly poled with respect to a control point 11 at the terminus of a control path. As a result, they are similarly affected by gating signals supplied from the control path. In their low resistance state the diodes pass source energy and the gate is open. In the high resistance state source energy is blocked and the gate is closed.

To achieve gating path bistability, the control path includes a biasing impedance element which acts in concert with a voltage supplied by a biasing source 12. The biasing element is advantageously a negative resistance diode 13 which is poled oppositely from the gating diodes with respect to the control point 11. Once the gate is rendered bistable, its setting is determined by brief control signals supplied by a pulse source in the control path.

Besides its biasing role, the control path diode 13 also increases gating efficiency by providing a substantial impedance when the gate is open and a negligible impedance when the gate is closed. As a result, with an open gate substantially all of the source energy passes into the load as desired, only a negligible amount being diverted into the control path. Contrariwise, with a closed gate any source energy leaking through the gating elements 10–1 and 10–2, as at high frequencies where the impedances of the intrinsic shunt capacitances are low, is prevented from appearing at the load and is instead diverted into the control path.

Figure 2:
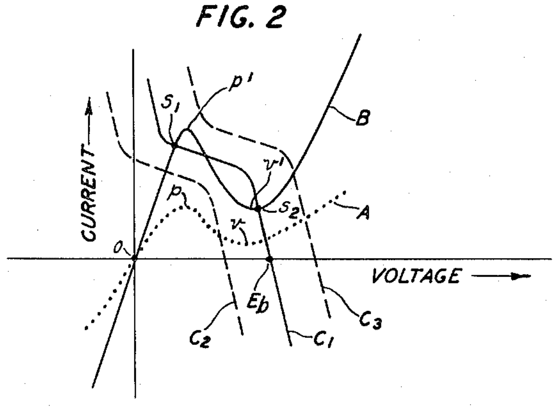
FIG. 2 is a set of graphs serving to explain the operation of the holding gate of FIG. 1.

That a diode holding gate of FIG. 1 is able to retain either its closed gate condition or its open gate condition, during the absence of an applied control signal, while simultaneously increasing gating efficiency, will be clear from the graphical analysis presented in FIG. 2. For illustration the curves are those associated with negative resistance diodes of the voltage-controlled type, being of the kind described in the copending application of R. L. Wallace, filed October 8, 1959 now Patent 3,062,971, issued Nov. 6, 1962. A typical current-voltage characteristic for a single voltage-controlled diode is depicted by the dotted line curve A in FIG. 2. For positive magnitudes of current and voltage, the characteristic curve exhibits three distinct regions. The first region, extending from the origin *o* and terminating in a peak point *p*, is one of positive resistance. From the peak point and extending to a valley point *v*, the characteristic turns downward through a region of negative resistance and represents the negative resistance condition of the diode. Beyond the valley point, the characteristic once again turns upward through another region of positive resistance. Being nonlinear, the characteristic depicts incremental resistive magnitudes that vary continuously through wide ranges, effecting transitions from plus to minus infinity at the peak and valley points. However, in the vicinity of the valley point the resistance changes gradually so that there exists a wide range of voltages over which the incremental resistance of the diode is substantial. The significance of this high resistance range will become apparent shortly. It is also to be noted that for negative magnitudes of current and voltage, a voltage-controlled diode, unlike a conventional rectifying diode, has incremental resistances of relatively small magnitude.

To facilitate analysis, assume that the impedances represented by resistors 15–1 and 15–2 associated with the source and the load are of small magnitudes so that the current-voltage characteristic seen from the control path of FIG. 1 is given essentially by doubling the dotted line characteristic for a single diode along the axis of ordinates, thus to produce the composite characteristic, curve B. Of course, when the load and source impedances are substantial, the composite characteristic will have to be modified in well known fashion. However, such a modification does not affect the principle of operation being here described.

Although the biasing impedance element is also a voltage-controlled diode, its composite characteristic $C_1$ desirably omits any negative resistance region, and its peak and valley points differ from those described previously. With p-n junction diodes of the negative resistance variety these effects are subject to control in the course of manufacture, being dependent upon the "doping" and the aerial extent of the p-n junction. Or, the negative resistance region can be masked and the peak and valley points altered by a shunt padding resistor 14 of the kind shown in FIG. 1. The resultant characteristic $C_1$ has a substantial range over which the incremental impedance is very high.

As indicated in FIG. 2, the compensated control characteristic $C_1$ is plotted backwards, by analogy with conventional load-line graphical analysis, starting at the magnitude of the bias voltage $E_b$ along the axis of abscissas. When the biasing voltage is proportioned appropriately, the gating and control characteristics B and $C_1$ have complementary intersection points $S_1$ and $S_2$, i.e., the control resistance is appreciable where the gating resistance is negligible and vice versa. Hence, when the gate is open, the control path is essentially isolated both from the source and from the load by virtue of its substantial impedance, but when the gate is closed, the control path presents a negligible impedance and is able to divert any leakage energy from the source. As for the point of intersection in the negative resistance region of the gating characteristic, it is a point of unstable equilibrium and cannot represent an operating point.

Assume that the gate is closed, i.e., it has been set with its stable equilibrium operating point $S_2$ in the high voltage region of the gating characteristic. Then to open the gate, a control signal is momentarily applied to shift the control characteristic $C_1$ in the direction of decreasing voltage until it passes beyond the valley point $v'$ to the position of graph $C_2$, after which the locus of operation switches to the low voltage region of positive resistance. Upon termination of the control signal, the control characteristic returns to its original position but the gate remains set at its low voltage point $S_1$ of stable equilibrium. Subsequently, to close the gate, a control signal is momentarily applied in the direction of increasing voltage causing the control characteristic to shift beyond the peak point $p'$ to the position of curve $C_3$ so that once again the operating locus is in the high voltage region of positive resistance.

Figure 3:
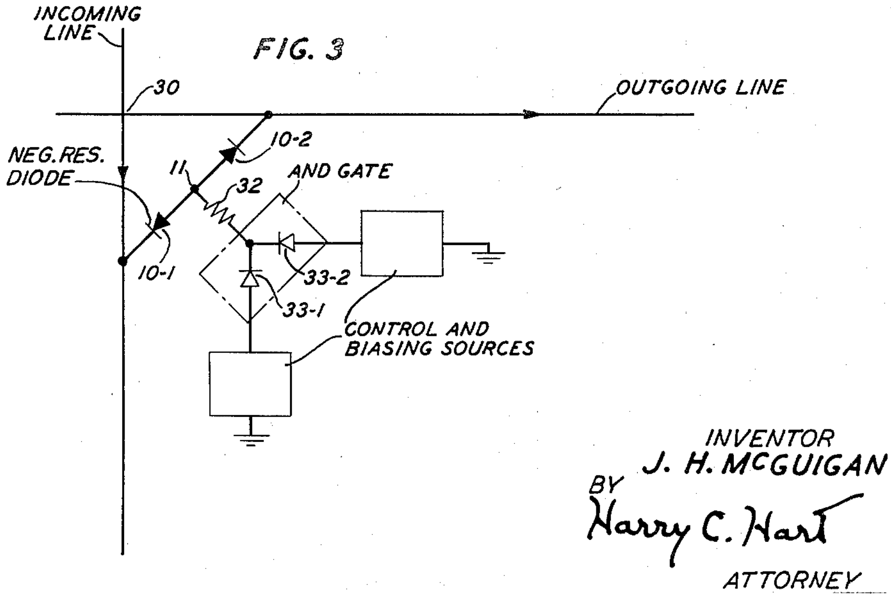
FIG. 3 is a schematic diagram of a cross-point gate with diode holding action.

Various adaptations can be used to achieve the kind of gating afforded by the invention. One of these is given in FIG. 3 for a crossbar holding switch which employs negative resistance diodes 10–1 and 10–2 in a gating path that interconnects an incoming line with an outgoing line near a common cross point 30. Affixed to the gating path at its control point 11 is a resistive biasing element 32 to which biasing and control signals are applied from respective sources connected to a subsidiary AND gate constituted of two rectifying diodes 33–1 and 33–2. As before, the biasing element and biasing voltages are proportioned to attain gating path bistability. Because of the AND gate, simultaneously applied negative polarity control signals from the two sources are required to open the gating path. On the other hand, a positive polarity control signal from one of the sources suffices to close the gate at the termination of a gating interval. It is to be noted that FIG. 3 may be taken as representing a single cross point in a large rectangular array.

Numerous other biasing arrangements and adaptations of diode holding gates in general will occur to those skilled in the art.

What is claimed is:

1. Apparatus for gating a source to a load which comprises a gating path interconnecting the source with the load and including a control point and tandem connected negative resistance diodes similarly poled with respect to said control point, each diode having a current-voltage characteristic with low and high resistance regions of positive resistance separated by an intervening region of negative resistance, a control path including means characterized by a load line intersecting both regions of positive resistance for biasing said diodes to have two stable equilibrium states respectively corresponding to said low and high resistance regions, and means for momentarily shifting said load line to cause said diodes to shift from one of said stable equilibrium states to the other of said stable equilibrium states, thereby to control the resistance of said gating path.

2. Apparatus as defined in claim 1 wherein said biasing means comprises means affording high resistance to said control path for the diodes in said gating path in their low resistance state of stable equilibrium and low resistance to said control path for the diodes in said gating path in their high, resistance state of stable equilibrium.

3. A gating network which comprises a source and a load connected to a common potential point, two dandem connected negative resistance diodes, similarly poled with respect to a control point, interconnecting said source with said load, each diode being characterized by a current-voltage characteristic having a low resistance region of positive resistance extending to a peak point and separated by an intervening region of negative resistance from a high resistance region of positive resistance commencing at a valley point, means connected to said control point for driving each of said diodes to have two conditions of stable equilibrium, a closed gate condition of stable equilibrium in said high resistance region and an open gate condition of stable equilibrium in said low resistance region, the driving means being characterized by a load line intersecting both said low resistance region and said high resistance region, and control signal means interconnecting said driving means with said common point for momentarily shifting the position of said load line in order to shift said diodes from one of said conditions of stable equilibrium to the other of said conditions of stable equilibrium, wherein momentarily depressing said load line below said valley point causes said diodes to shift to said open gate condition of stable equilibrium in said low resistance region, and wherein momentarily elevating said load line above said peak point causes said diodes to shift to said closed gate condition of stable equilibrium in said high resistance region.

4. Apparatus as defined in claim 3 wherein said driving means comprises a negative resistance diode interconnecting said control point with said control signal means and imparting to said driving means a negligible impedance during said closed gate condition and a substantial impedance during said open gate condition, whereby signal energy from the source is directed into the path of said driving means during said closed gate condition and excluded from said path during said open gate condition, thereby to enhance the gating efficiency of said network.

5. Apparatus for controllably transferring a signal from a source to a load which comprises a gating path including a control point and a plurality of bistable negative resistance gating elements interconnecting the source with the load, wherein said gating elements are connected in tandem and similarly poled with respect to said control point, means for biasing said bistable gating elements at said control point to have alternative equilibrium signal states which are complementary in impedance to the equilibrium signal states those of said biasing means, and a source of momentarily applied control signals in circuit relation with said biasing means for shifting said bistable gating elements from one of said alternative equilibrium signal states to the other of said alternative equilibrium signal states.

6. Apparatus for gating a source to a load which comprises a gating path including a control point and tandem connected gating elements interconnecting the source with the load, said gating elements being similarly poled with respect to said control point, each gating element having a low resistance condition and a high resistance condition separated by an intervening region of negative resistance, means connected to said control point and characterized by similar low and high resistance conditions for biasing said gating elements to operate bistably in either of said low and high resistance conditions, each of said gating element resistance conditions complementing one of the resistance conditions of said biasing means so that said gating elements spontaneously attain stable equilibrium in either one of said resistance conditions and at the same time said biasing means operates in a complementary equilibrium resistance condition, and means in circuit relation with said biasing means for shifting said gating elements from one to the other of said stable equilibrium resistance conditions by applying momentarily a control signal to said biasing means.

7. A bistable transmission gate which comprises three negative resistance diodes connected to a common control point, one of said diodes being dissimilarly poled at said control point with respect to the other two which are respectively connected in tandem between a source and a load, an impedance element connected in shunt with said dissimilarly poled diode, and means for controlling said tandem connected diodes through said dissimilarly poled diode.

8. Apparatus for gating a source to a load, which comprises a gating path interconnecting the source with the load and including a control point and tandem connected negative resistance diodes, said negative resistance diodes being similarly poled with respect to said control point and, each diode having a current-voltage characteristic with low and high resistance regions of positive resistance separated by an intervening region of negative resistance, a control path interconnecting said control point with said load and said source and including means for biasing said diodes to either one of two conditions of stable equilibrium in similar ones of their positive resistance regions, and means included in said control path for momentarily energizing said diodes to shift from one condition of stable equilibrium to the other condition of stable equilibrium, thereby to control the resistance of said gating path.

9. Gating apparatus comprising an input having first and second terminals, an output having first and second terminals, a first negative resistance diode having first and second electrodes, the first electrode of said first diode being connected to the first terminal of said input, a second negative resistance diode, similar to the first, having first and second electrodes, the first electrode of said second diode being connected to the first terminal of said output, a third negative resistance diode having first and second electrodes, the first electrode of said diode being connected jointly to the second electrode of said first diode and the second electrode of said second diode, a biasing resistor connected in shunt with said third diode, a biasing battery connected to the second electrode of said third diode, and a pulse signal source interconnecting said battery jointly with the second terminal of said input and the second terminal of said output.

10. A crossbar holding switch comprising a line for incoming signals, a line for outgoing signals, a gating path including first and second negative resistance diodes and interconnecting the incoming and outgoing lines, an AND gate having two input terminals and an output terminal, a resistive biasing element interconnecting the output terminal of said AND gate with the diodes of said gating path, a first biasing and control source connected to one input terminal of said AND gate, and a second biasing and control source connected to the other input terminal of said AND gate.

References Cited by the Examiner

UNITED STATES PATENTS

| | | | |
|---|---|---|---|
| 2,576,026 | 11/1951 | Meacham. | |
| 2,777,956 | 1/1957 | Kretzmer. | |
| 2,951,124 | 8/1960 | Hussey et al. | |
| 2,959,689 | 11/1960 | Gilbert ------------ | 307—88.5 |
| 3,027,464 | 3/1962 | Kosonocky --------- | 307—88.5 |

ARTHUR GAUSS, *Primary Examiner.*

GEORGE N. WESTBY, *Examiner.*